(12) United States Patent
Kim et al.

(10) Patent No.: US 10,411,032 B2
(45) Date of Patent: Sep. 10, 2019

(54) THREE-DIMENSIONAL SEMICONDUCTOR DEVICES INCLUDING VERTICAL STRUCTURES WITH VARIED SPACING

(71) Applicant: Samsung Electronics Co., Ltd., Suwon-si, Gyeonggi-do (KR)

(72) Inventors: Sungjoong Kim, Seoul (KR); Joon-Sung Lim, Yongin-si (KR); Sung-Min Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/982,216

(22) Filed: May 17, 2018

(65) Prior Publication Data

US 2019/0043881 A1    Feb. 7, 2019

(30) Foreign Application Priority Data

Aug. 2, 2017  (KR) .......................... 10-2017-0098204

(51) Int. Cl.
| | |
|---|---|
| *H01L 27/11582* | (2017.01) |
| *H01L 27/1157* | (2017.01) |
| *G11C 16/04* | (2006.01) |
| *H01L 29/423* | (2006.01) |
| *H01L 29/66* | (2006.01) |

(52) U.S. Cl.
CPC .... *H01L 27/11582* (2013.01); *G11C 16/0483* (2013.01); *H01L 27/1157* (2013.01); *H01L 29/4234* (2013.01); *H01L 29/6681* (2013.01)

(58) Field of Classification Search
None
See application file for complete search history.

(56) References Cited

U.S. PATENT DOCUMENTS

| | | | |
|---|---|---|---|
| 9,082,826 B2 | 7/2015 | Chandrashekar et al. | |
| 9,177,613 B2 | 11/2015 | Lee et al. | |
| 9,373,635 B2 | 6/2016 | Jung et al. | |
| 9,406,692 B2 | 8/2016 | Lee | |
| 9,576,973 B2 | 2/2017 | Lee et al. | |
| 2012/0208347 A1* | 8/2012 | Hwang ............... | H01L 27/1157 438/430 |
| 2015/0194435 A1 | 7/2015 | Lee | |
| 2015/0340377 A1 | 11/2015 | Lee | |
| 2016/0049419 A1 | 2/2016 | Lee et al. | |

(Continued)

FOREIGN PATENT DOCUMENTS

CN    106847821    6/2017

*Primary Examiner* — Dung A. Le
(74) *Attorney, Agent, or Firm* — Sughrue Mion, PLLC

(57) ABSTRACT

A three-dimensional semiconductor device is disclosed. The device may include an electrode structure that can include a plurality of electrodes that are stacked on a substrate and extend in a first direction. Vertical structures can penetrate the electrode structure to provide a plurality of columns spaced apart from each other in a second direction crossing the first direction. The plurality of columns can include first and second edge columns located adjacent to respective opposite edges of the electrode structure, and the plurality of columns can include a center column located between the first and second edge columns. Distances between adjacent ones of the plurality of columns can decrease in a direction from the first and second edge columns toward the center column.

8 Claims, 17 Drawing Sheets

(56) References Cited

U.S. PATENT DOCUMENTS

| | | |
|---|---|---|
| 2016/0240547 A1 | 8/2016 | Tagami et al. |
| 2016/0267991 A1 | 9/2016 | Hashimoto et al. |
| 2016/0343612 A1 | 11/2016 | Wang et al. |
| 2017/0040339 A1 | 2/2017 | Lee |
| 2017/0069656 A1 | 3/2017 | Minami |
| 2017/0077108 A1 | 3/2017 | Kawaguchi et al. |
| 2017/0133389 A1* | 5/2017 | Yun .................. H01L 23/5226 |
| 2017/0200676 A1 | 7/2017 | Jeong et al. |
| 2019/0027490 A1* | 1/2019 | Shin .................. H01L 27/11582 |

* cited by examiner

# THREE-DIMENSIONAL SEMICONDUCTOR DEVICES INCLUDING VERTICAL STRUCTURES WITH VARIED SPACING

CROSS-REFERENCE TO RELATED APPLICATIONS

This U.S. non-provisional patent application claims priority under 35 U.S.C. § 119 to Korean Patent Application No. 10-2017-0098204, filed on Aug. 2, 2017, in the Korean Intellectual Property Office, the entire contents of which are hereby incorporated by reference.

BACKGROUND

The present disclosure relates to a semiconductor device, and in particular, to a three-dimensional semiconductor device.

Since the integration of semiconductor devices can be an important factor in determining product price/performance, increased integration may be needed. In the case of conventional two-dimensional or planar semiconductor devices, since integration may be mainly determined by the area occupied by a unit memory cell, the level of integration achieved may be influenced by the technology used to form fine patterns. However, such technology may be relatively expensive and therefore may impose some practical limitations as to the level of integration for two-dimensional or planar semiconductor devices solely provided by such technology. To overcome such limitations, there have been recently proposed three-dimensional semiconductor memory devices including three-dimensionally arranged memory cells.

SUMMARY

According to some embodiments of the inventive concept, a three-dimensional semiconductor device may include an electrode structure that can include a plurality of electrodes that are stacked on a substrate and extend in a first direction. Vertical structures can penetrate the electrode structure to provide a plurality of columns spaced apart from each other in a second direction crossing the first direction. The plurality of columns can include first and second edge columns located adjacent to respective opposite edges of the electrode structure, and the plurality of columns can include a center column located between the first and second edge columns. Each of the plurality of columns includes the vertical structures arranged in the first direction. Distances between adjacent ones of the plurality of columns can decrease in a direction from the first and second edge columns toward the center column.

According to some embodiments of the inventive concept, a three-dimensional semiconductor device may include an electrode structure including a plurality of electrodes stacked on a substrate and extending in a first direction and vertical structures penetrating the electrode structure and forming a plurality of columns spaced apart from each other in a second direction crossing the first direction. Each of the plurality of columns includes the vertical structures arranged in the first direction and spaced apart from each other by substantially equal distances. The plurality of columns can include first and second edge columns located adjacent the respective opposite edges of the electrode structure, and the plurality of columns can include a center column located between the first and second edge columns, and further can include an intermediate column between the first and second edge columns and the center column. The first edge column can include a first vertical structure, the intermediate column can include a second vertical structure adjacent to the first vertical structure in the second direction. The center column can include a third vertical structure adjacent to the second vertical structure in the second direction, and a first shortest distance between the first and second vertical structures can be greater than a second shortest distance between the second and third vertical structures.

According to some embodiments of the inventive concept, a three-dimensional semiconductor device may include electrode structures, which are spaced apart from each other with a common source region interposed therebetween, and each of which includes a plurality of electrodes stacked on a substrate. Vertical structures can be provided to penetrate the electrode structures, wherein each of the electrode structures can include upper selection gates and cell gates below the upper selection gates. The vertical structures can include a first vertical structure adjacent to the common source region and a dummy vertical structure between the upper selection gates and the shortest distances between the vertical structures provided between the first vertical structure and the dummy vertical structure can decrease in a direction from the first vertical structure to the dummy vertical structure. Diameters of the vertical structures increase from the first vertical structure to the dummy vertical structure.

According to some embodiments of the inventive concept, a three-dimensional semiconductor device may include electrode structures, spaced apart from each other and each includes a plurality of electrodes stacked on a substrate. Trenches can extend in a first direction interposed between the electrode structures and vertical structures can penetrate the electrode structures, where the vertical structures can be arranged to provide a plurality of columns spaced apart from each other in a second direction crossing the first direction. Each of the plurality of columns includes the vertical structures arranged in the first direction. Each of the electrode structures can include a pair of upper selection electrodes horizontally spaced apart from each other with a dummy insulating separation layer interposed therebetween, and each of the electrode structures can include a plurality of cell electrodes located below the pair of upper selection electrodes. The plurality of columns can include first to fifth columns, which are sequentially arranged in a direction from the trenches to the dummy insulating separation layer and the distances between ones of the plurality of columns can decrease in a direction from the first column toward the fifth column.

According to some embodiments of the inventive concept, a three-dimensional semiconductor device may include nearest neighboring ones of a plurality of vertical channel structures located in adjacent columns of the plurality of vertical channel structures in a row direction are spaced apart from one another at decreasing distances in a direction toward a central one of the plurality of vertical channel structures.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 8A to 11A are plan views illustrating a method of fabricating a three-dimensional semiconductor device according to some embodiments of the inventive concept.

FIGS. 8B to 11B are sectional views taken along line III-III' of FIGS. 8A to 11A, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
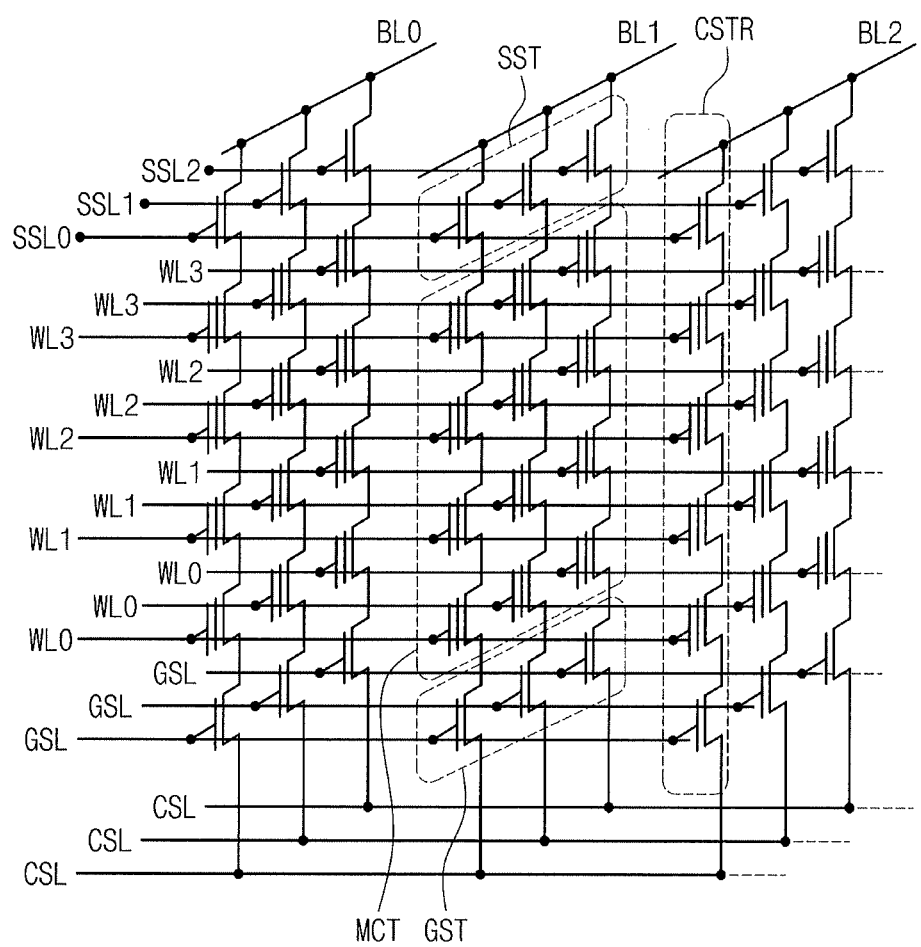
FIG. 1 is a circuit diagram schematically illustrating a cell array of a semiconductor memory device according to some embodiments of the inventive concept.

FIG. 1 is a circuit diagram schematically illustrating a cell array of a semiconductor memory device according to some embodiments of the inventive concept.

According to some embodiments of the inventive concept, as appreciated by the present inventors, a distance between columns of vertical structures may be made to be relatively large near an entrance used to a supply a source gas (used to form portions of the vertical structures) compared to the distance between the columns of the vertical structures that are relatively remote from the entrance. This varied spacing may make it possible to more easily supply the source gas between the columns near the entrance so as to reach the more remote the columns of the vertical structures. Moreover, making the distance between columns of vertical structures that are more remote from the entrance smaller may reduce the likelihood of forming a void in an electrode due to the fact that less material is need to fill the spaces between the columns of vertical structures. Accordingly, it may be possible to improve process reliability of a three-dimensional semiconductor device.

A three-dimensional semiconductor device according to some embodiments of the inventive concept may include a common source line CSL, a plurality of bit lines BL0-BL2, and a plurality of cell strings CSTR between the common source line CSL and the bit lines BL0-BL2. The bit lines BL0-BL2 may be two-dimensionally arranged and a plurality of the cell strings CSTR may be connected in parallel to each of the bit lines BL0-BL2. Accordingly, the cell strings CSTR may also be two-dimensionally arranged on the common source line CSL or the substrate.

Each of the cell strings CSTR may be configured to include a ground selection transistor GST coupled to the common source line CSL, a string selection transistor SST coupled to one of the bit lines BL0-BL2, and a plurality of memory cell transistors MCT provided between the ground and string selection transistors GST and SST. The ground selection transistor GST, the string selection transistor SST, and the memory cell transistors MCT may be connected in series. In addition, at least one ground selection line GSL, a plurality of word lines WL0-WL3, and a plurality of string selection lines SSL0-SSL2 may be provided between the common source line CSL and the bit lines BL0-BL2 and may be used as gate electrodes of the ground selection transistor GST, the memory cell transistors MCT, and the string selection transistors SST, respectively.

The gate electrodes of the ground selection transistors GST may be connected in common to the ground selection line GSL, thereby being in an equipotential state. In addition, the gate electrodes of the memory cell transistors MCT, which are located at the substantially same height from the ground selection line GSL, may also be connected in common to one of the word lines WL0-WL3, thereby being in an equipotential state. Since each cell string CSTR includes the plurality of memory cell transistors MCT that are located at different heights from the ground selection line GSL, the word lines WL0-WL3 may form a multi-layered structure the ground selection line GSL and the bit lines BL0-BL2.

Each of the ground and string selection transistors GST and SST and the memory cell transistors MCT may be a metal-oxide-semiconductor field effect transistor (MOSFET), in which a vertically-extending semiconductor pattern is used as a channel region. In certain embodiments, the vertical semiconductor pattern, in conjunction with the ground selection line GSL, the word lines WL0-WL3, and the string selection lines SSL0-SSL2, may constitute a MOS capacitor. In this case, if a voltage higher than a threshold voltage of the MOS capacitor is applied to the ground selection line GSL, the word lines WL0-WL3, and the string selection lines SSL0-SSL2, an inversion layer may be formed between the lines (e.g., by a fringe field) to allow the ground selection transistor GST, the memory cell transistors MCT, and the string selection transistor SST to be electrically connected to each other.

Figure 2:
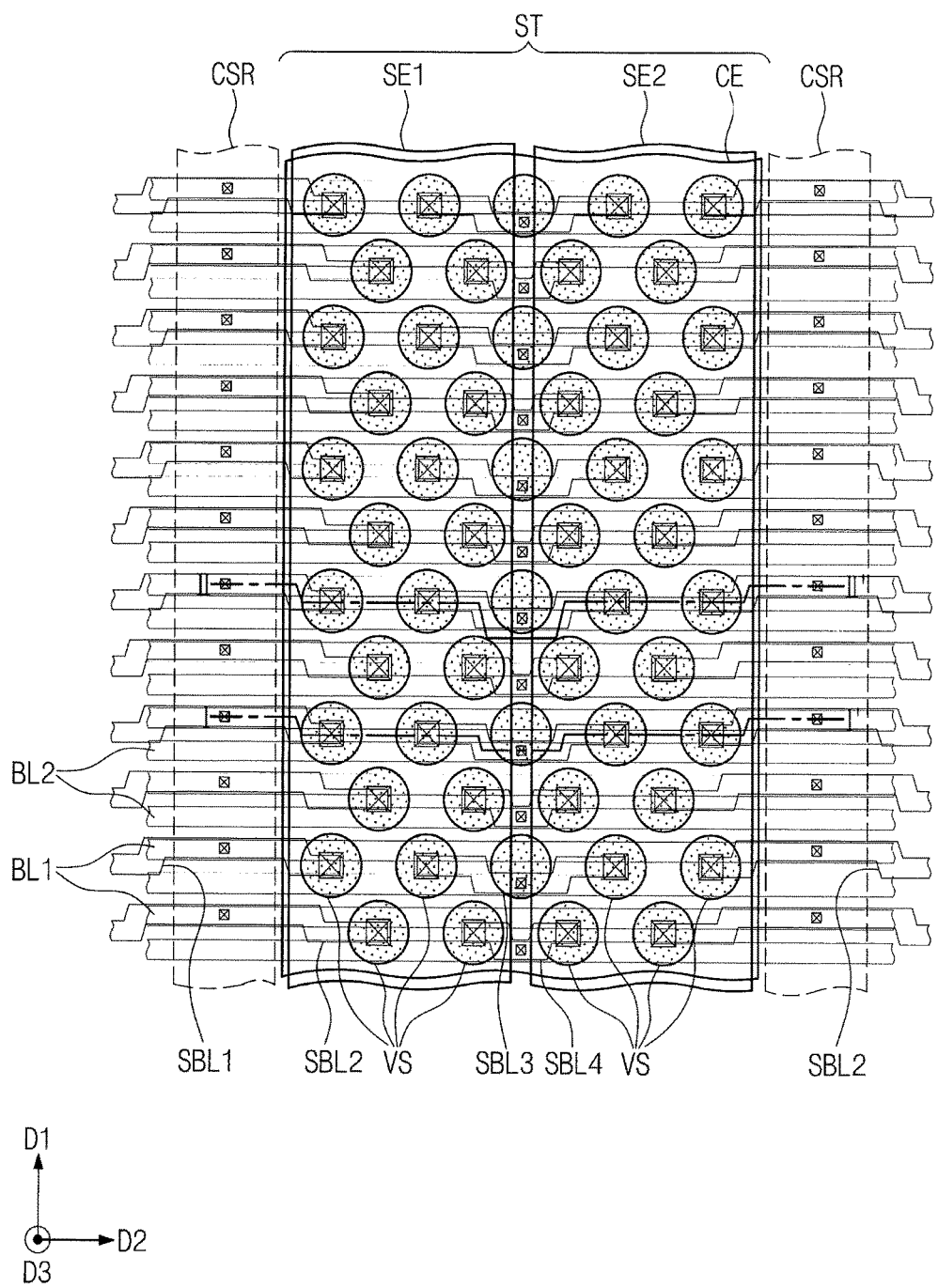
FIG. 2 is a plan view illustrating a cell array of a three-dimensional semiconductor device according to some embodiments of the inventive concept.
Figure 3A:
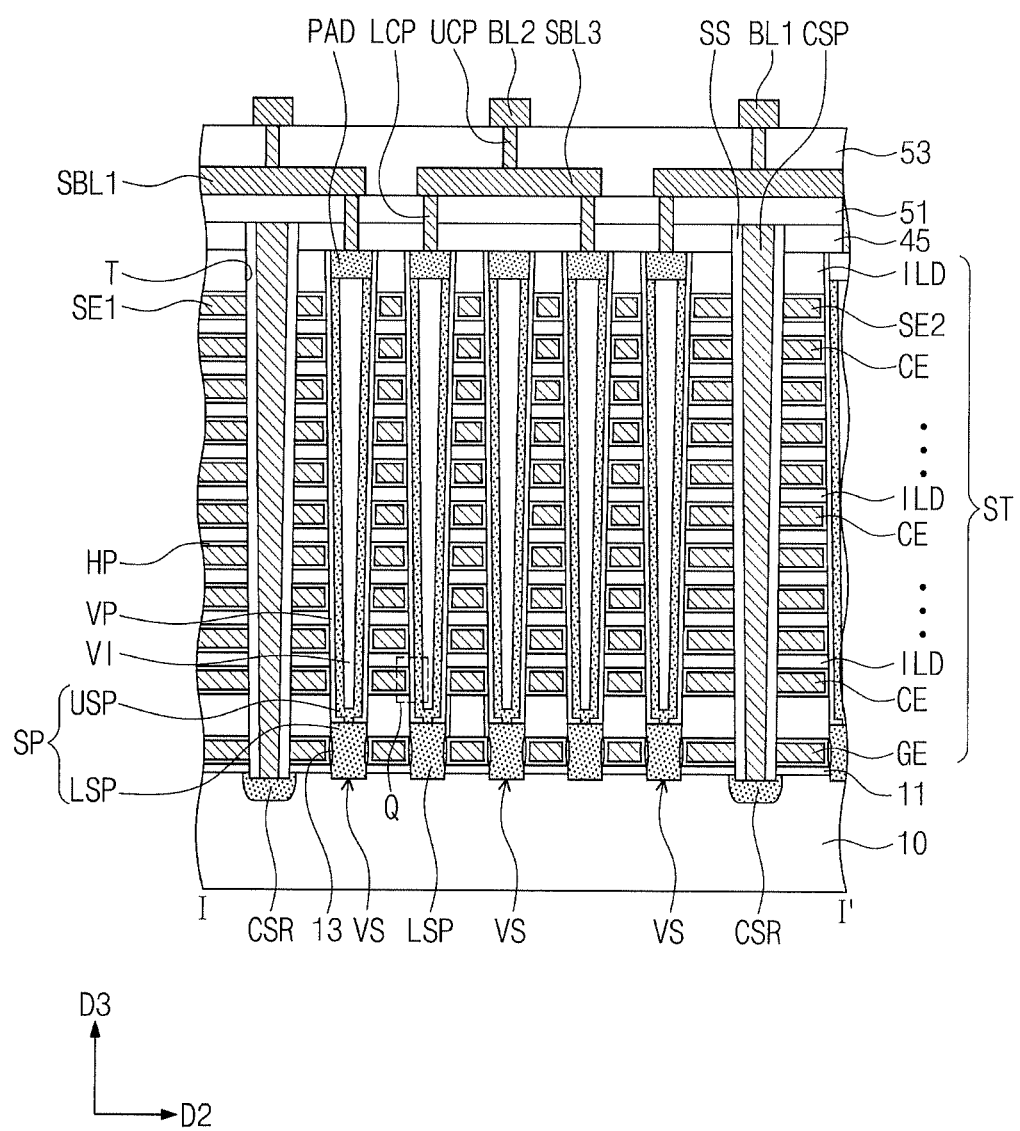
FIG. 3A is a sectional view taken along line I-I' of FIG. 2.
Figure 3B:
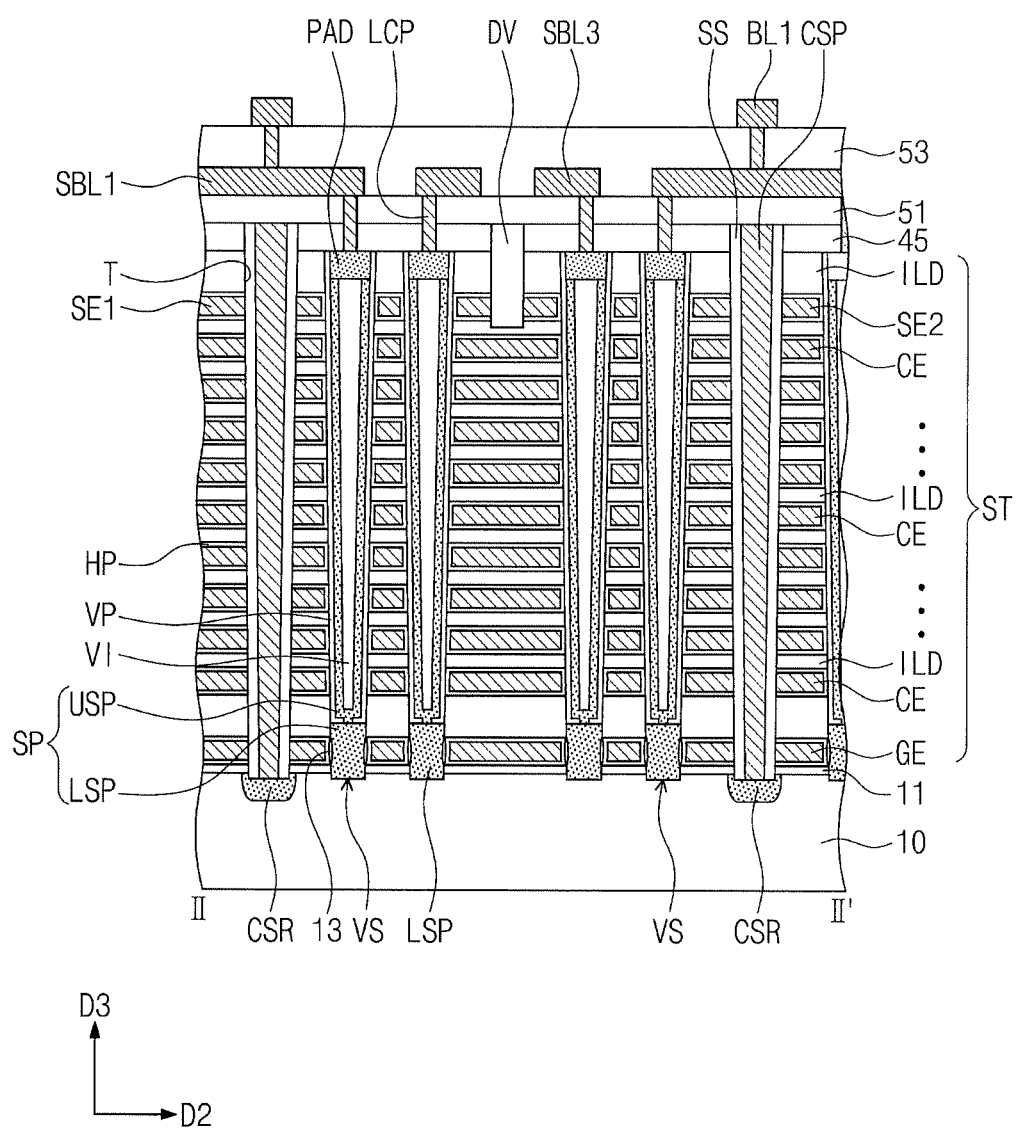
FIG. 3B is a sectional view taken along line II-II' of FIG. 2.
Figure 3C:
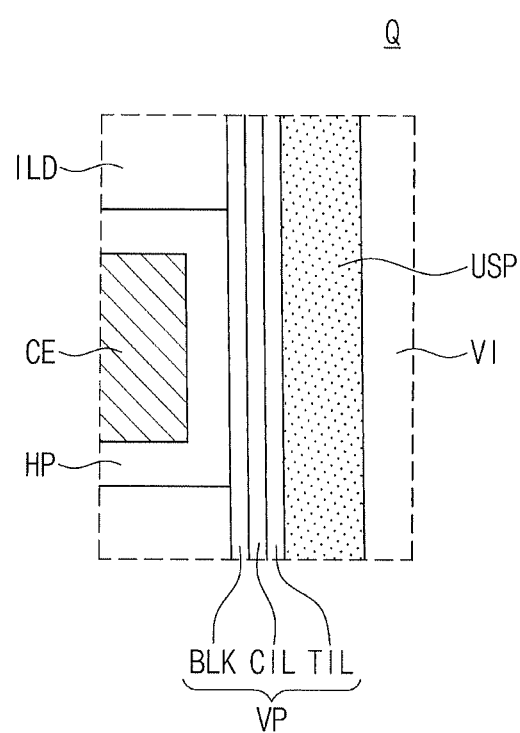
FIG. 3C is an enlarged view illustrating a portion 'Q' of FIG. 3A.

FIG. 2 is a plan view illustrating a cell array of a three-dimensional semiconductor device according to some embodiments of the inventive concept. FIG. 3A is a sectional view taken along line I-I' of FIG. 2. FIG. 3B is a sectional view taken along line II-II' of FIG. 2. FIG. 3C is an enlarged view illustrating a portion 'Q' of FIG. 3A.

Referring to FIGS. 2 and 3A to 3C, an electrode structure ST may be provided on a substrate 10. The substrate 10 may include at least one of a semiconductor material (e.g., silicon), an insulating material (e.g., glass), or a semiconductor or conductive material covered with an insulating material. For example, the substrate 10 may be a silicon wafer, which is of a first conductivity type.

For convenience in illustration, the electrode structure ST is singly illustrated, but in certain embodiments, a plurality of the electrode structures ST may be provided. Each of the electrode structures ST may extend in a first direction D1. The electrode structures ST may be spaced apart from each other in a second direction D2 by trenches T interposed therebetween, where the first and second directions D1 and D2 are not parallel to each other. Each of the first and second directions D1 and D2 may be parallel to a top surface of the substrate 10. In some embodiments, the second direction D2 may be perpendicular to the second direction D1.

The electrode structure ST may include a plurality of electrodes GE, CE, and SE, which are stacked in a third direction D3 that is perpendicular to both of the first and second directions D1 and D2. In other words, a plurality of electrodes GE, CE, and SE may be vertically stacked on the substrate 10, and the electrode structures ST may further include insulating layers ILD, each of which is interposed between a corresponding pair of the electrodes GE, CE, and SE. Each of the electrodes GE, CE, and SE may include a barrier metal layer and a metal layer stacked sequentially. The electrodes GE, CE, and SE may be formed of or include metal nitrides (e.g., TiN, TaN, or WN) and/or metal materials (e.g., W, Al, Ti, Ta, Co, or Cu). The insulating layers ILD may be formed of or include silicon oxide.

In some embodiments, the electrodes GE, CE, and SE may include a lower selection electrode GE provided adjacent to the substrate 10, a plurality of cell electrodes CE stacked on the lower selection electrode GE, and an upper selection electrode SE stacked on the uppermost one of the cell electrodes CE. The lower selection electrode GE may be used as a part of the ground selection line GSL of FIG. 1, and the upper selection electrode SE may be used as a part of the string selection lines SSL0-SSL2. The upper selection electrode SE may include a first upper selection electrode SE1 and a second upper selection electrode SE2, which are horizontally separated from each other by a dummy insulating separation layer DV. A bottom surface of the dummy insulating separation layer DV may be positioned at a level higher than a top surface of the uppermost one of the cell electrodes CE. The dummy insulating separation layer DV may extend in the first direction D1 and may be provided to fill a space between vertical structures VS constituting a center column CC (see, for example, FIG. 4). As an example, the dummy insulating separation layer DV may be formed of or include silicon oxide.

Common source regions CSR may be provided in the substrate 10 and at both sides of the electrode structure ST. The common source regions CSR may extend parallel to the electrode structure ST in the first direction D1 and may be spaced apart from each other in the second direction D2. The electrode structures ST may be spaced apart from each other, and each of the common source regions CSR may be interposed between the electrode structures ST. The common source regions CSR may be formed by doping the substrate 10 with impurities (e.g., arsenic (As) or phosphorus (P)) and may have a second conductivity type (e.g., n-type) that is different from that of the substrate 10 having the first conductivity type.

A common source plug CSP may be coupled to the common source region CSR, and a sidewall insulating spacer SS may be interposed between the common source plug CSP and the electrode structure ST. In some embodiments, the common source plug CSP may be a plate-shaped structure having a substantially uniform upper width and extending in the first direction D1.

Vertical structures VS may be provided to penetrate the electrode structures ST. Each of the vertical structures VS may include a vertical semiconductor pattern SP, which is electrically connected to a portion (e.g., a well impurity region of the first conductivity type) of the substrate 10, and a vertical insulating pattern VP, which is provided to surround the vertical semiconductor pattern SP.

The vertical semiconductor pattern SP may include a semiconductor material and may be used as channel regions of the ground selection transistors GST, the string selection transistors SST, and the memory cell transistors MCT described with reference, for example, to FIG. 1. In some embodiments, the vertical semiconductor pattern SP may include a lower semiconductor pattern LSP and an upper semiconductor pattern USP. The lower semiconductor pattern LSP may be in contact with the substrate 10. As an example, the lower semiconductor pattern LSP may be a pillar-shaped pattern penetrating the lower selection electrode GE. The lower semiconductor pattern LSP may be formed of a semiconductor material having the same conductivity type as the substrate 10. As an example, the lower semiconductor pattern LSP may be an epitaxial pattern, which is formed by a selective epitaxial growth process using the substrate 10 as a seed layer. A thermal oxide layer 13 may be provided between the lower semiconductor pattern LSP and the lower selection electrode GE.

The upper semiconductor pattern USP may be in contact with a top surface of the lower semiconductor pattern LSP. The upper semiconductor pattern USP may be shaped like a bottom-closed hollow pipe or macaroni. An inner space in the upper semiconductor pattern USP may be filled with an insulating gapfill layer VI. The upper semiconductor pattern USP may be in an un-doped state or may be doped to have the same conductivity type as the substrate 10. As an example, the upper semiconductor pattern USP may be formed of or include at least one of silicon (Si), germanium (Ge), or compounds thereof. Each of the vertical structures VS may include a conductive pad PAD provided at the highest level thereof, and in some embodiments, the conductive pad PAD may be a doped semiconductor pattern or may be formed of a conductive material.

In some embodiments, the vertical insulating pattern VP may be provided to surround a side wall of the vertical semiconductor pattern SP. The vertical insulating pattern VP may include a charge storing layer, which is used as a data-storing element of a NAND FLASH memory device. For example, the vertical insulating pattern VP may include a tunnel insulating layer TIL, a charge storing layer CSL, and a blocking insulating layer BLK, which constitute a data storing layer of a NAND FLASH memory device, as shown in FIG. 3C. Data stored in the data storing layer may be changed using a Fowler-Nordheim (FN) tunneling effect, which may be caused by a voltage difference between the vertical semiconductor pattern SP, in which a semiconductor material is contained, and the electrodes GE, CE, and SE.

The charge storing layer CSL may be one or more insulating layers with abundant trap sites and/or one or more insulating layers with nano particles. For example, the charge storing layer CSL may be formed of or include a trap insulating layer, a floating gate electrode, or an insulating layer containing conductive nano dots. In some embodiments, the charge storing layer CSL may be formed of or include at least one of a silicon nitride layer, a silicon oxynitride layer, a silicon-rich nitride layer, a nanocrystalline silicon layer, or a laminated trap layer. The tunnel insulating layer TIL may be formed of or include one (e.g., silicon oxide) of materials having a greater band gap than the charge storing layer CSL. Alternatively, the tunnel insulating layer TIL may be formed of or include one of high-k dielectrics (e.g., aluminum oxide and hafnium oxide). The blocking insulating layer BLK may be formed of or include one of materials, having respective band gaps are less than that of the tunnel insulating layer TIL and greater than that of the charge storing layer CSL. For example, the blocking insulating layer BLK may include at least one of high-k dielectrics (e.g., aluminum oxide and hafnium oxide).

In some embodiments, the vertical insulating pattern VP may extend in the third direction D3, which is perpendicular to the top surface of the substrate 10. In other words, the vertical insulating pattern VP may be vertically extended to have portions between the cell electrodes CE and the vertical semiconductor pattern SP and between the upper selection electrode SE and the vertical semiconductor pattern SP.

A horizontal insulating pattern HP may be horizontally extended from a region between the vertical insulating pattern VP and a side surface of each of the electrodes GE, CE, and SE to cover top and bottom surfaces of each of the electrodes GE, CE, and SE. The horizontal insulating pattern HP may be used as a part of a charge storing layer of a NAND FLASH memory device. The horizontal insulating pattern HP may be formed of or include one of high-k dielectric materials (e.g., aluminum oxide and hafnium oxide), which have dielectric constants less than that of the blocking insulating layer BLK.

A capping insulating pattern 45 may be provided on the electrode structure ST to cover top surfaces of the conductive pads PAD of the vertical structures VS. A first interlayered insulating layer 51 may be provided on the capping insulating pattern 45 to cover a top surface of the common source plug CSP.

Subsidiary lines SBL1, SBL2, SBL3, and SBL4 may be provided on the first interlayered insulating layer 51, and each of the subsidiary lines SBL1, SBL2, SBL3, and SBL4 may be used to connect adjacent ones of the vertical structures VS to each other through lower contacts LCP. As an example, the subsidiary lines may include first to fourth subsidiary lines SBL1-SBL4. Each of the first to fourth subsidiary lines SBL1-SBL4 may be provided to have a longitudinal axis parallel to the second direction D2.

As an example, the first and second subsidiary lines SBL1 and SBL2 may be provided to cross the common source region CSR. The second subsidiary line SBL2 may be longer than the first subsidiary line SBL1. The third and fourth subsidiary lines SBL3 and SBL4 may be provided to cross the dummy insulating separation layer DV. The third subsidiary line SBL3 may be longer than the fourth subsidiary line SBL4.

The first and second bit lines BL1 and BL2 may be provided on a second interlayered insulating layer 53. The first and second bit lines BL1 and BL2 may extend in the second direction D2 across the electrode structure ST and may be alternately arranged (i.e., interspersed) in the first direction D1. The first bit lines BL1 may be connected to the first or second subsidiary lines SBL1 or SBL2 through an upper contact UCP, and the second bit lines BL2 may be connected to the third or fourth subsidiary lines SBL3 or SBL4 through the upper contact UCP.

Figure 4:
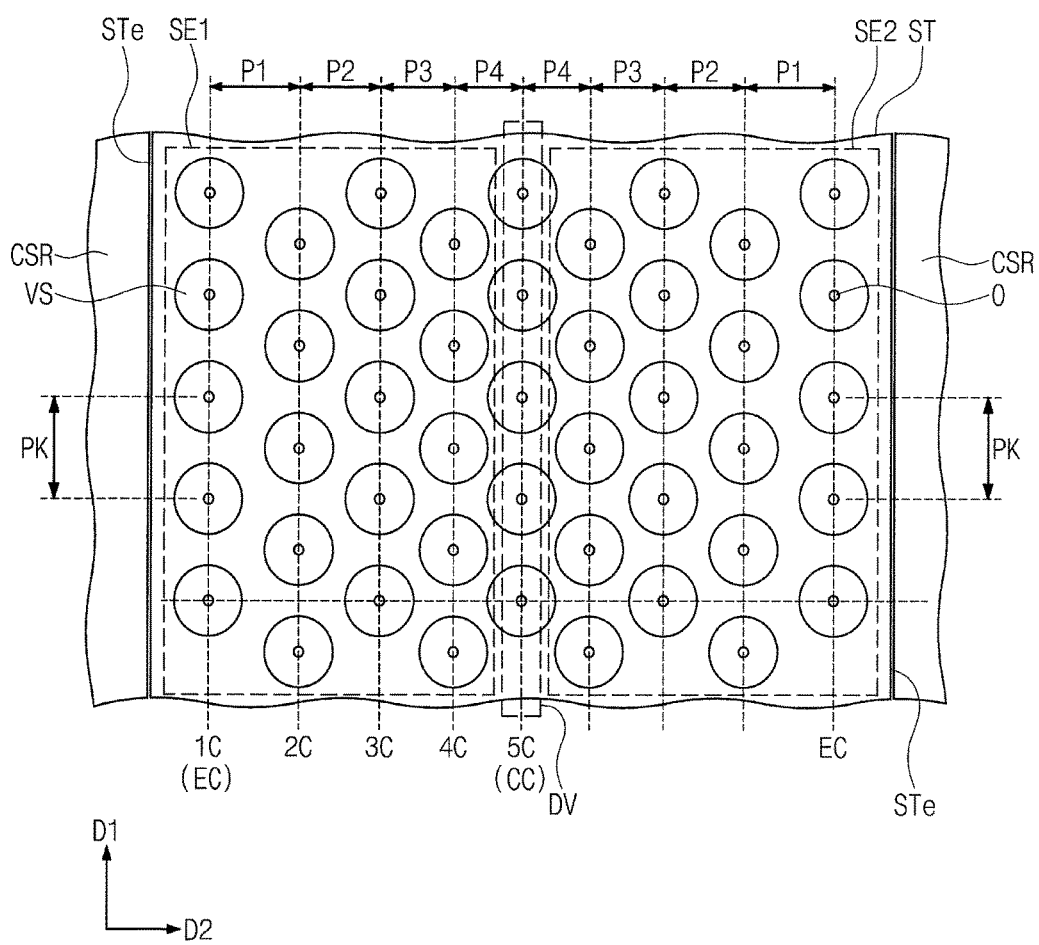
FIG. 4 is a plan view illustrating arrangement of vertical structures according to some embodiments of the inventive concept.

FIG. 4 is a plan view illustrating an arrangement of the vertical structures VS according to some embodiments of the inventive concept. In FIG. 4, for convenience in illustration, top surfaces of the vertical structures VS will be schematically illustrated to describe the arrangement of the vertical structures VS.

The vertical structures VS may be arranged to form a plurality of columns, which are spaced apart from each other in the second direction D2. The vertical structures VS constituting each column may be arranged in the first direction D1. As an example, the vertical structures VS in each electrode structure ST may be arranged in nine columns when traversing the electrode structure in the second direction D2, as shown in FIG. 4. In certain embodiments, the number of the columns may be less than or greater than 9. For the sake of simplicity, the description that follows will refer to an example in which the vertical structures VS are arranged in nine columns in each electrode structure ST.

The columns of the vertical structures VS may include edge columns EC, which are respectively located adjacent to opposite edges STe of the electrode structure ST. When viewed in a plan view, the opposite edges STe may be located to face the common source regions CSR. The columns of the vertical structures VS may also include a center column CC, which is located between the edge columns EC and is farthest from the opposite edges STe. The center column CC may be equidistant from the edge columns EC. The remaining columns between the edge columns EC and the center column CC may be referred to as 'intermediate columns'.

In some embodiments, the vertical structures VS constituting the center column CC may be dummy (i.e., inactive) vertical structures that are not used to constitute the memory cells. As an example, the vertical structures VS constituting the center column CC may not be connected to the first to fourth subsidiary lines SBL1-SBL4 and/or the first and second bit lines BL1 and BL2. The vertical structures VS may be arranged (in the plan view) to have mirror symmetry with respect to the center column CC or the dummy insulating separation layer DV. In the case where the vertical structures VS are arranged in nine columns, a first column 1C and a ninth column may correspond to the edge columns EC, and the fifth column 5C may correspond to the center column CC. The second to fourth columns 2C-4C may correspond to the intermediate columns. Due to the aforedescribed mirror symmetry, the fifth to ninth columns may be symmetric about the first to fifth columns, and thus, the first to fifth columns 1C to 5C will be mainly described below.

One of two adjacent ones of the columns may be shifted relative to one another in the first direction D1. For example, each of the vertical structures VS constituting the second column 2C may be shifted in the first direction D1 relative to the vertical structures VS constituting the first column 1C and the vertical structures VS in the third column 3C. There are no other vertical structures VS located between the two vertical structures VS that are adjacent. There may be no other column located between the two adjacent columns.

In some embodiments, a distance between the columns may decrease in a direction from the edge columns EC to the center column CC. Hereinafter, a first column distance Pl, a second column distance P2, a third column distance P3, and a fourth column distance P4 will be used to refer to distances between the first and second columns 1C and 2C, between the second and third columns 2C and 3C, between the third and fourth columns 3C and 4C, and between the fourth and fifth columns 4C and 5C, respectively. In some embodiments, the second column distance P2 may be less than the first column distance P1, the third column distance P3 may be less than the second column distance P2, and the fourth column distance P4 may be less than the third column distance P3. In the present specification, the distance between the columns may be defined as a distance between imaginary lines, each of which is selected to connect centers O of the vertical structures VS constituting each column.

The column distances may decrease with the same reduction rate from the first column 1C to the fifth column 5C, but the inventive concept is not limited thereto. The reduction rate of the column distances may be gradually increased or decreased. As an example, the reduction rate of the column distances may range from about 3% to about 20%. In some embodiments, the reduction rate can be defined as the amount that the distance separating the adjacent columns decreases from one column to the next.

In each column, a distance PK between the vertical structures VS in the first direction D1 may be substantially the same. That is, the vertical structures VS may be arranged with the same distance in the first direction D1. In the first to fifth columns 1C-5C, the distance PK in the first direction D1 may be substantially the same.

Figure 5:
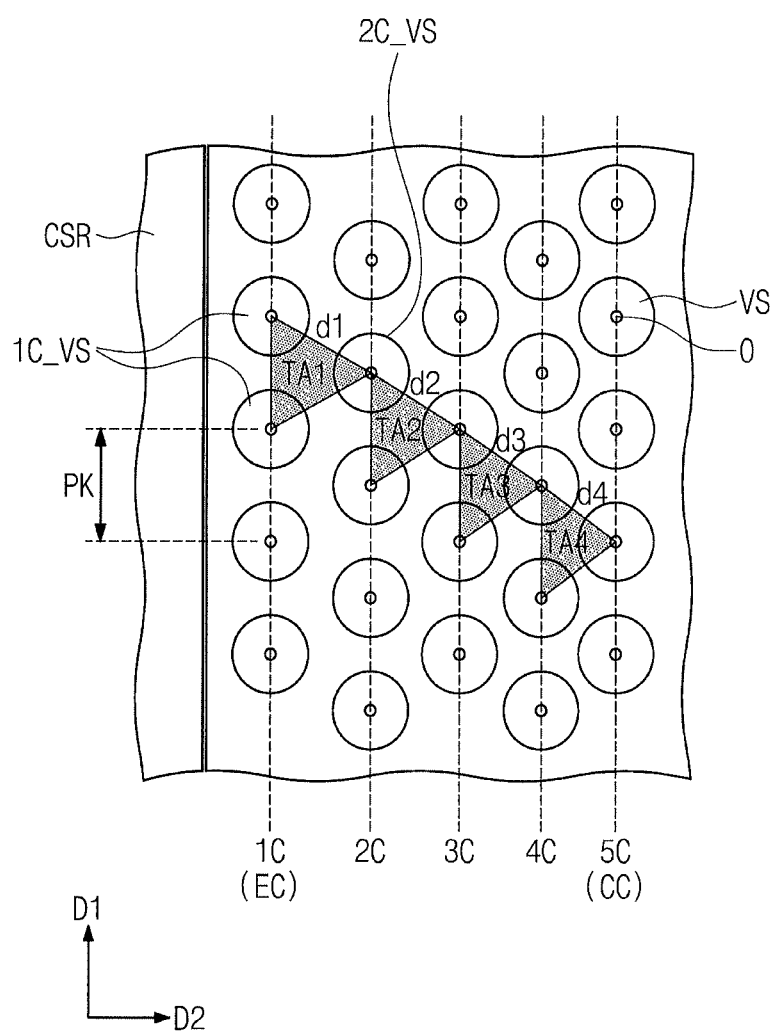
FIG. 5 is a plan view illustrating arrangement of vertical structures according to some embodiments of the inventive concept.

FIG. 5 is a plan view illustrating an arrangement of the vertical structures VS according to some embodiments of the inventive concept. An adjacent pair of vertical structures 1C_VS constituting the first column 1C and a vertical structure 2C_VS of the second column 2C adjacent thereto may be arranged in such a way that a first triangle TA1 connecting centers thereof is an isosceles triangle. A distance between the adjacent pair of vertical structures 1C_VS may correspond to the distance PK in the first direction D1. The adjacent pair of vertical structures 1C_VS constituting the first column 1C may be spaced apart from the vertical structure 2C_VS of the second column 2C by substantially the same distance of d1.

Similarly, a second isosceles triangle TA2 may be defined between the second column 2C and the third column 3C, and a third isosceles triangle TA3 may be defined between the third column 3C and the fourth column 4C, and a fourth isosceles triangle TA4 may be defined between the fourth column 4C and the fifth column 5C. A length of equal sides (or legs) in each isosceles triangle may decrease from the first isosceles triangle TA1 to the fourth isosceles triangle TA4 (i.e., d1>d2>d3>d4).

Figure 6:
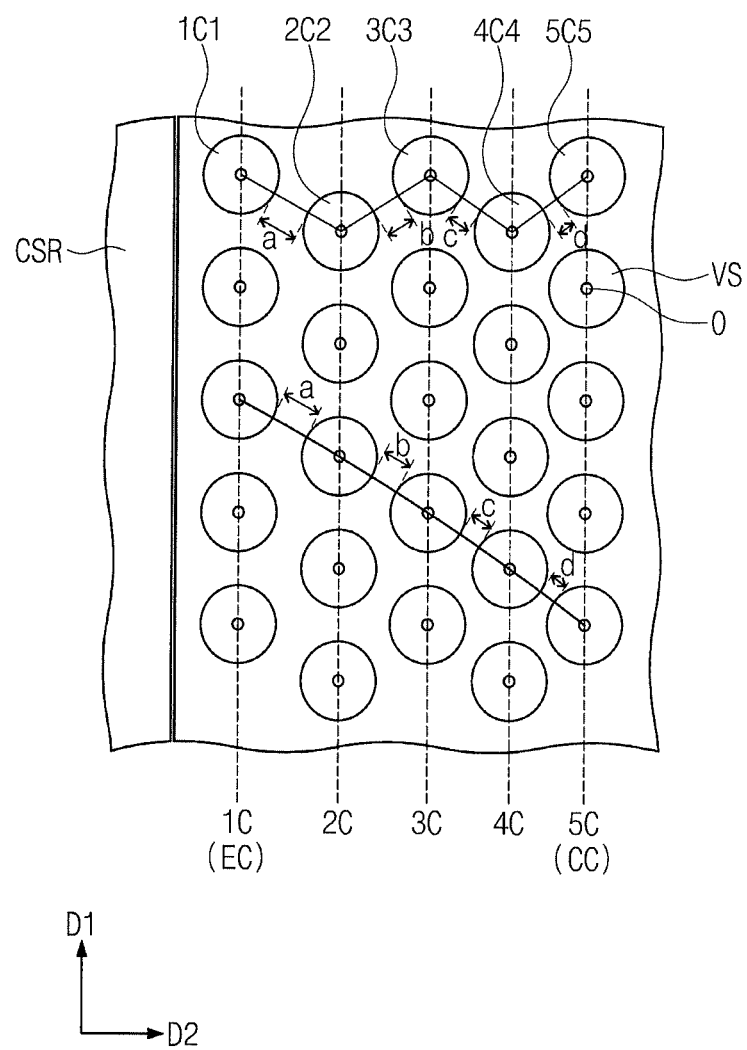
FIG. 6 is a plan view illustrating arrangement of vertical structures according to some embodiments of the inventive concept.

FIG. 6 is a plan view illustrating an arrangement of the vertical structures VS according to some embodiments of the inventive concept.

The shortest distances between the vertical structures, which are respectively selected from the columns and are closest to each other, may decrease in a direction from the edge column EC to the center column CC. As an example, the shortest distances between vertical structures 1C1-5C5, which are respectively selected from the first to fifth columns 1C-5C and are closest to each other, may be a first shortest distance a, a second shortest distance b, a third shortest distance c, and a fourth shortest distance d. In some embodiments, the second shortest distance b may be less than the first shortest distance a, the third shortest distance c may be less than the second shortest distance b, and the fourth shortest distance d may be less than the third shortest distance c. In the present specification, the shortest distance between the vertical structures VS may refer to the shortest distance between outer sidewalls of the vertical structures VS.

The closest vertical structures 1C1-5C5 may be arranged to form a zigzag arrangement in the second direction D2. The closest vertical structures 1C1-5C5 may be arranged on a line extending in a direction crossing the first and second directions D1 and D2. The line may not be a straight line.

Figure 7:
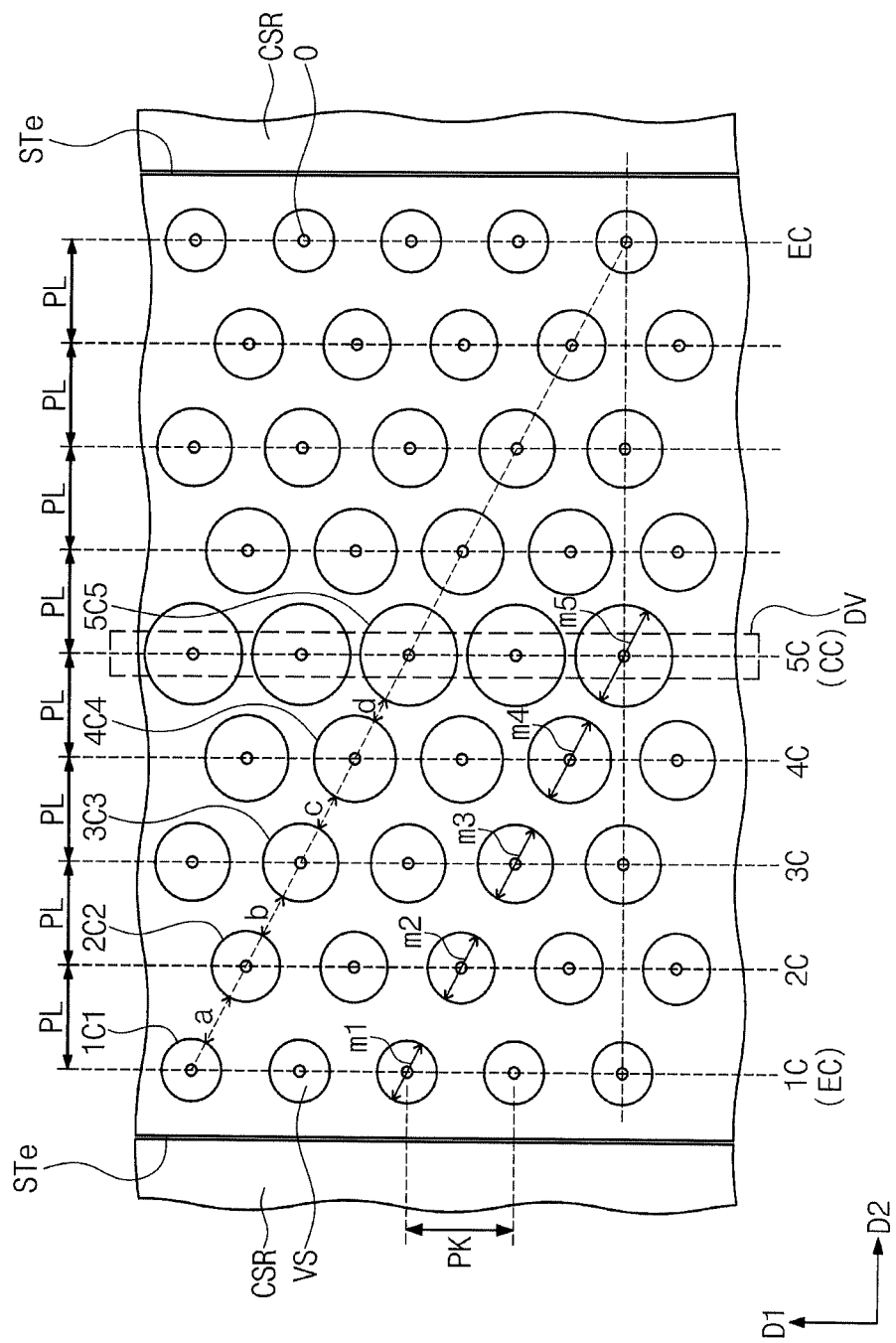
FIG. 7 is a plan view illustrating arrangement of vertical structures according to some embodiments of the inventive concept.

FIG. 7 is a plan view illustrating an arrangement of the vertical structures VS according to some embodiments of the inventive concept.

In the present embodiment, a plurality of the columns may be spaced apart from each other by substantially the same distance. As an example, each of the first to fifth columns 1C-5C may be spaced apart from another column that is adjacent thereto by substantially the same distance PL. In each column, a distance PK between the vertical structures VS in the first direction D1 may be substantially the same. In the first to fifth columns, the distance PK in the first direction D1 may be substantially the same.

Diameters of the vertical structures VS may increase in a direction from the edge columns EC to the center column CC. In the present specification, a diameter of the vertical structure VS may refer to a diameter of a top surface of the vertical structure VS. As an example, the diameter m2 of the vertical structures of the second column 2C may be greater than the diameter m1 of the vertical structures of the first column 1C, the diameter m3 of the vertical structures of the third column 3C may be greater than the diameter m2 of the vertical structures of the second column 2C, the diameter m4 of the vertical structures of the fourth column 4C may be greater than the diameter m3 of vertical structures of the third column 3C, and the diameter m5 of the vertical structures of the fifth column 5C may be greater than the diameter m4 of the vertical structures of the fourth column 4C.

The shortest distances between vertical structures 1C1-5C5, which are respectively selected from the first to fifth columns 1C-5C and are closest to each other, may be a first shortest distance a, a second shortest distance b, a third shortest distance c, and a fourth shortest distance d. Owing to a difference in diameter between the vertical structures VS, the second shortest distance b may be less than the first shortest distance a, the third shortest distance c may be less than the second shortest distance b, and the fourth shortest distance d may be less than the third shortest distance c.

In some embodiments, a distance between the columns or between the vertical structures may decrease in a direction from the edge columns EC to the center column CC. A process of forming the plurality of electrodes GE, CE, and SE may include filling an empty space between the vertical structures VS with a source gas, and in this case, a space between the vertical structures VS may affect size, frequency, and a probability of the formation of a void in the electrodes GE, CE, and SE. According to some embodiments of the inventive concept, the distance between the columns may be relatively large at a region close to the edges STe of the electrode structure and near the entrance of a supply path of a source gas, and thus, the source gas may be more easily supplied into the space between the columns. The distance between the columns may be relatively small at a region far apart from the edges STe, and thus, the space between the vertical structures VS may be more easily filled with the gate electrode material. Accordingly, it may be possible to improve process reliability of a three-dimensional semiconductor device.

FIGS. 8A to 11A are plan views illustrating a method of fabricating a three-dimensional semiconductor device according to some embodiments of the inventive concept. FIGS. 8B to 11B are sectional views taken along line III-III' of FIGS. 8A to 11A, respectively.

Figure 8A:
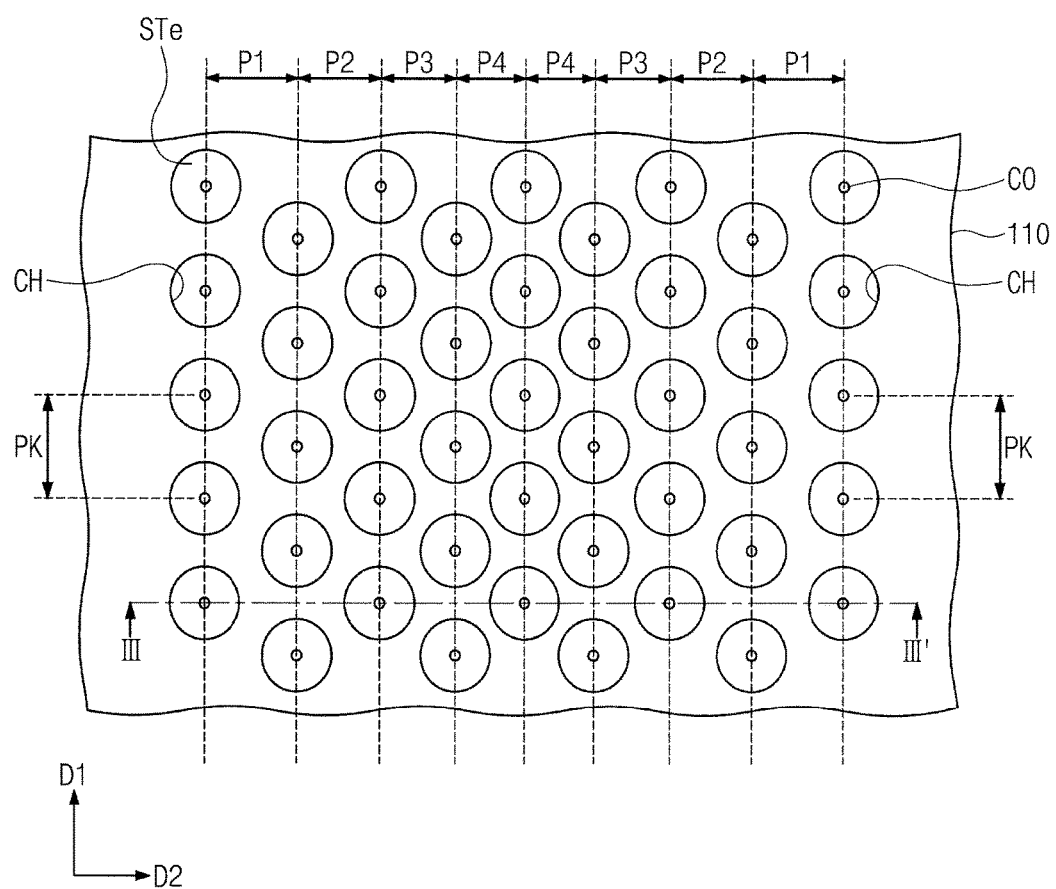
Figure 8B:
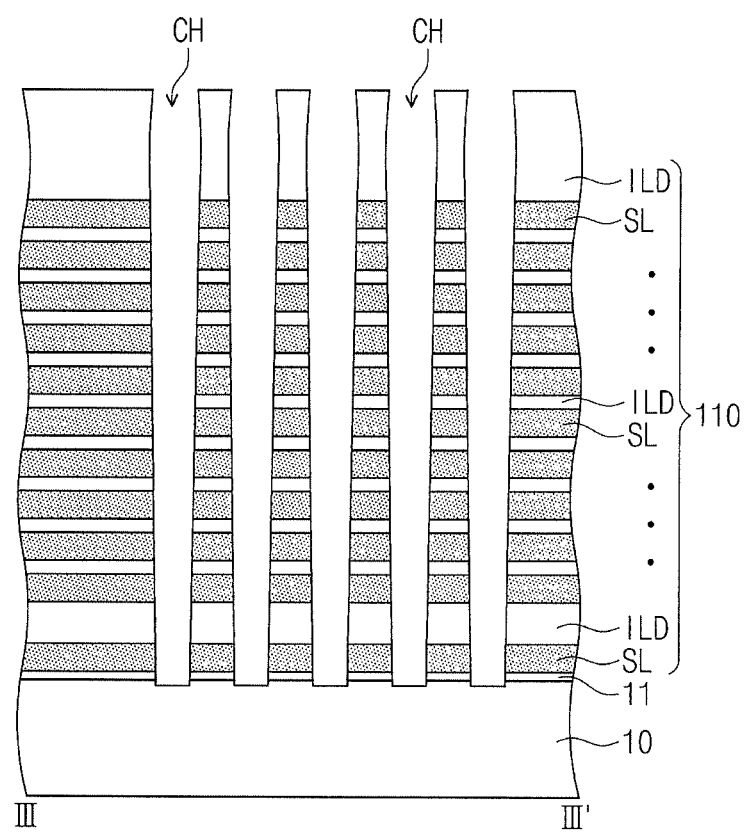

Referring to FIGS. 8A and 8B, a layered structure 110 may be formed on the substrate 10. The layered structure 110 may include sacrificial layers SL and insulating layers ILD, which are alternately and repeatedly stacked on the substrate 10. The substrate 10 may include at least one of a semiconductor material (e.g., silicon), an insulating material (e.g., glass), or a semiconductor or conductive material covered with an insulating material. For example, the substrate 10 may be a silicon wafer, which is of a first conductivity type.

The sacrificial layers SL may be formed of or include a material, which can be etched with a high etch selectivity with respect to the insulating layers ILD. For example, the sacrificial layers SL and the insulating layers ILD may have a high etch selectivity in a wet etching process using a chemical solution and a low etch selectivity in a dry etching process using an etching gas. As an example, the sacrificial layers SL and the insulating layers ILD may be formed of insulating materials having an etch selectivity with respect to each other. For example, the sacrificial layers SL may be formed of silicon nitride, and the insulating layers ILD may be formed of silicon oxide.

In some embodiments, the sacrificial layers SL may be formed to have substantially the same thickness. In certain embodiments, the lowermost one of the sacrificial layers SL may be formed to be thicker than the other of the sacrificial layers SL. The insulating layers ILD may have substantially the same thickness, but in certain embodiments, at least one of the insulating layers ILD may have a different thickness from the others. As an example, the uppermost one of the insulating layers ILD may be thicker than the others of the insulating layers ILD. Before the formation of the layered structure 110, a buffer insulating layer 11 may be formed to cover the top surface of the substrate 10. The buffer insulating layer 11 may be a silicon oxide layer and may be formed by using a thermal oxidation process or a deposition process. In some embodiments, a vertical thickness (or height) of the layered structure 110 may be changed depending on an integration density or capacity of the semiconductor memory device. For example, the vertical thickness of the layered structure 110 may be changed depending on the stacking number of the insulating layers ILD and the sacrificial layers SL.

After the formation of the layered structure 110, channel holes CH may be formed to penetrate the layered structure 110. The arrangement of the channel holes CH may correspond to the arrangement of the vertical structures VS previously described with reference to FIGS. 4 to 7.

As an example, the channel holes CH may be formed to have first to fourth column distances P1-P4, as in the arrangement of the vertical structures VS of FIG. 4. The channel holes CH may be formed in such a way that centers CO thereof are located at positions corresponding to the centers O of the vertical structures VS of, for example, FIG. 5. In addition, the channel holes CH may be spaced apart from each other by substantially the same distance PK in the first direction D1, as in the vertical structures VS of, for example, FIG. 4.

The formation of the channel holes CH may include forming a hard mask layer. The hard mask layer may be formed of or include at least one of silicon-containing materials (e.g., silicon oxide, silicon nitride, silicon oxynitride, or poly silicon), carbon-containing materials (e.g., amorphous carbon layer (ACL) or spin-on hardmask (SOH)), metallic materials (e.g., tungsten), or organic materials.

The channel holes CH may be formed to penetrate the layered structure 110 and the buffer insulating layer 11 and to expose the top surface of the substrate 10. In some embodiments, the channel holes CH may be formed by an anisotropic etching process, but each of the channel holes CH may be formed to be narrower at a lower portion of the channel holes CH compared to the width at an upper portion of the channel holes CH (i.e., to have an inclined side surface). In addition, the anisotropic etching process may be performed in an over-etching manner, and the top surface of the substrate 10 exposed by the channel holes CH may be partially recessed.

Figure 9A:
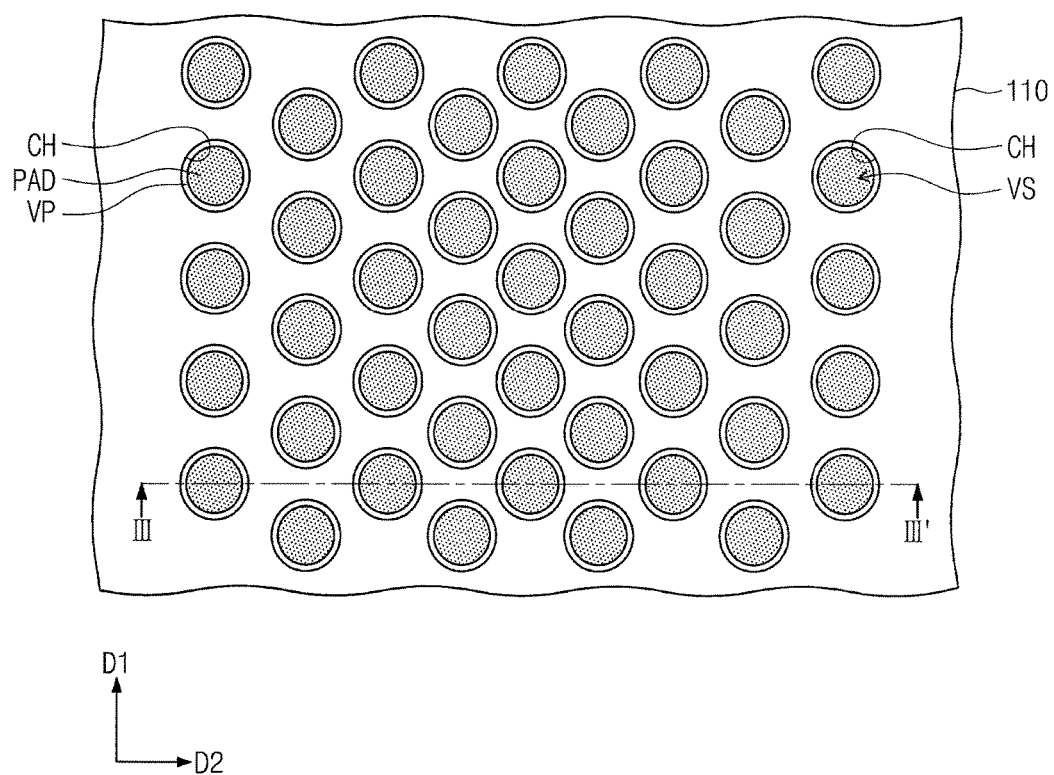
Figure 9B:
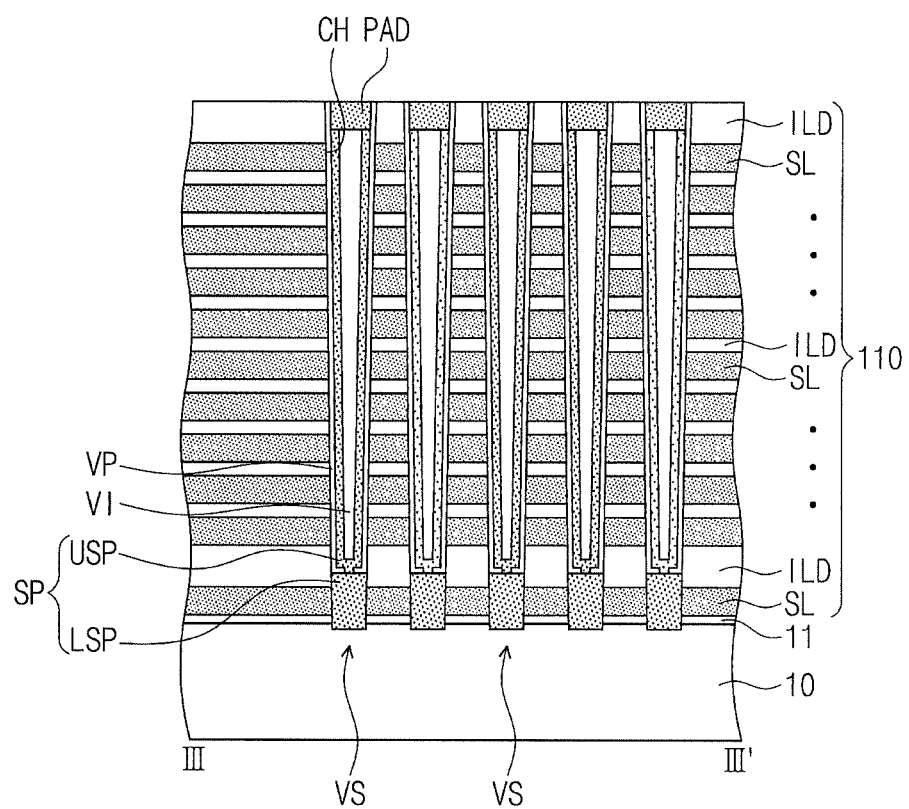

Referring to FIGS. 9A and 9B, vertical structures VS may be formed in the channel holes CH, respectively. The formation of the vertical structures VS may include forming a lower semiconductor pattern LSP and an upper semiconductor pattern USP in each of the channel holes.

The lower semiconductor pattern LSP may be formed by a selective epitaxial growth (SEG) process, in which the substrate 10 exposed by the channel holes CH is used as a seed layer. Accordingly, the lower semiconductor pattern LSP may be formed to fill lower portions of the channel holes CH or to have a pillar shape. The lower semiconductor pattern LSP may be formed to have a top surface that is positioned above a top surface of the lowest of the sacrificial layers SL.

The lower semiconductor pattern LSP may be formed to have a single- or poly-crystalline structure, but the inventive concept may not be limited thereto. The lower semiconductor pattern LSP may be formed of, for example, carbon nano structures, organic semiconductor materials, and/or compound semiconductor materials. The lower semiconductor pattern LSP may have the same conductivity type as the substrate 10. The lower semiconductor pattern LSP may be doped with impurities in an in-situ manner during a selective epitaxial growth process. In certain embodiments, after the formation of the lower semiconductor pattern LSP, an ion implantation process may be performed to inject impurities into the lower semiconductor pattern LSP.

The upper semiconductor pattern USP may be formed in the channel holes CH provided with the lower semiconductor pattern LSP. The upper semiconductor pattern USP may be in contact with the lower semiconductor pattern LSP. For example, the upper semiconductor pattern USP may be in contact with the lower semiconductor pattern LSP and may have a bottom-closed pipe shape or bottom-closed macaroni shape. An inner space of the upper semiconductor pattern USP may be filled with an insulating material or a gaseous material. The upper semiconductor pattern USP may be in an un-doped state or may be doped to have the same conductivity type as the substrate 10. The upper semiconductor pattern USP may be formed of or include at least one of silicon (Si), germanium (Ge), or compounds thereof and may be a doped or intrinsic semiconductor pattern. In addition, the upper semiconductor pattern USP may have one of single-crystalline, amorphous, and poly-crystalline structures.

An insulating gapfill layer VI may be formed to fill the channel holes CH provided with the upper semiconductor pattern USP. The formation of the insulating gapfill layer VI may include forming an insulating layer to fill the channel holes CH and performing a planarization process on the insulating layer. As an example, the insulating gapfill layer VI may be formed of or include silicon oxide.

A conductive pad D may be formed on or in a top portion of each of the upper semiconductor patterns USP. The conductive pad PAD may be a doped semiconductor pattern or may be formed of a conductive material. In some embodiments, before the formation of the upper semiconductor pattern USP, the vertical insulating pattern VP may be formed in each of the channel holes CH. The vertical insulating pattern VP may include one or more layers. In some embodiments, the vertical insulating pattern VP may be used as a part of a data storing layer. For example, the vertical insulating pattern VP may include a charge storing layer, which is used as a memory element of a NAND FLASH memory device. In some embodiments, the vertical insulating pattern VP may include the tunnel insulating layer TIL, the charge storing layer CSL, and the blocking insulating layer BLK described with reference to, for example, FIG. 3B. In certain embodiments, the vertical insulating pattern VP may be used as a memory element of a phase-change memory device or a variable resistance memory and may include a phase-change or variable-resistance layer.

Figure 10A:
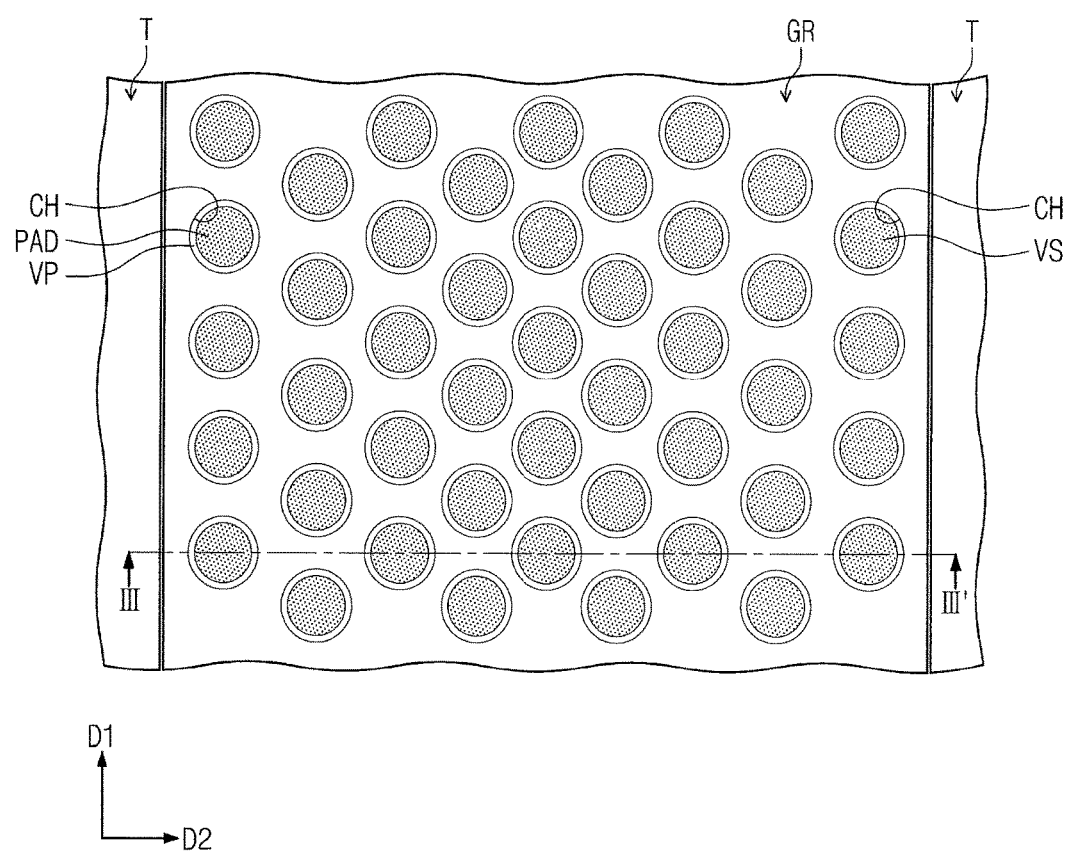
Figure 10B:
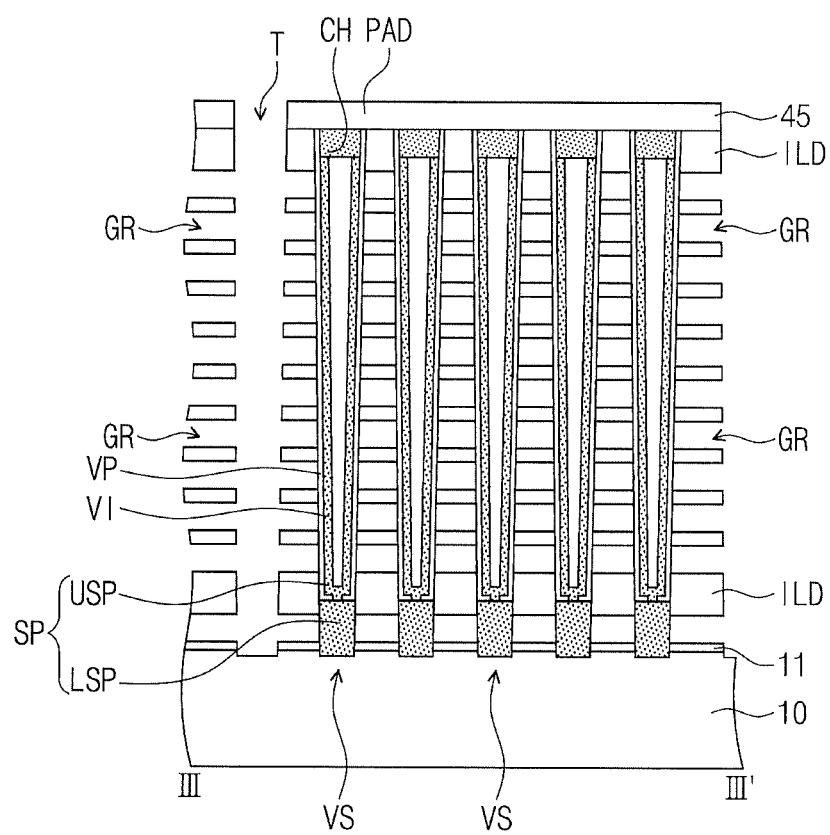

Referring to FIGS. 10A and 10B, the layered structure 110 may be patterned to form trenches T exposing the substrate 10. The trenches T may be formed to extend in the first direction D1 and to be spaced apart from each other in the second direction D2.

The formation of the trenches T may include forming a capping insulating layer to cover top surfaces of the vertical structures VS, forming a mask pattern (not shown) on the capping insulating layer to define positions, shapes, and arrangement of the trenches T, and anisotropically etching the layered structure 110 using the mask pattern as an etch mask. As a result of the formation of the trenches T, a capping insulating pattern 45 may be formed on the layered structure 110, and side surfaces of the sacrificial layers SL and the insulating layers ILD may be exposed by the trenches T.

Next, the sacrificial layers SL exposed by the trenches T may be removed to form gate regions GR. The gate regions GR may be formed by isotropically etching the sacrificial layers SL using an etch recipe having an etch selectivity with respect to the insulating layers ILD. For example, in the case where the sacrificial layers SL are formed of silicon nitride and the insulating layers ILD are formed of silicon oxide, the gate regions GR may be formed by isotropically etching the sacrificial layers SL using etching solution containing phosphoric acid. The gate regions GR may be horizontally extended from the trenches T to partially expose the vertical insulating patterns VP, and in particular, the lowest one of the gate regions GR may be formed to partially expose the lower semiconductor pattern LSP.

Figure 11A:
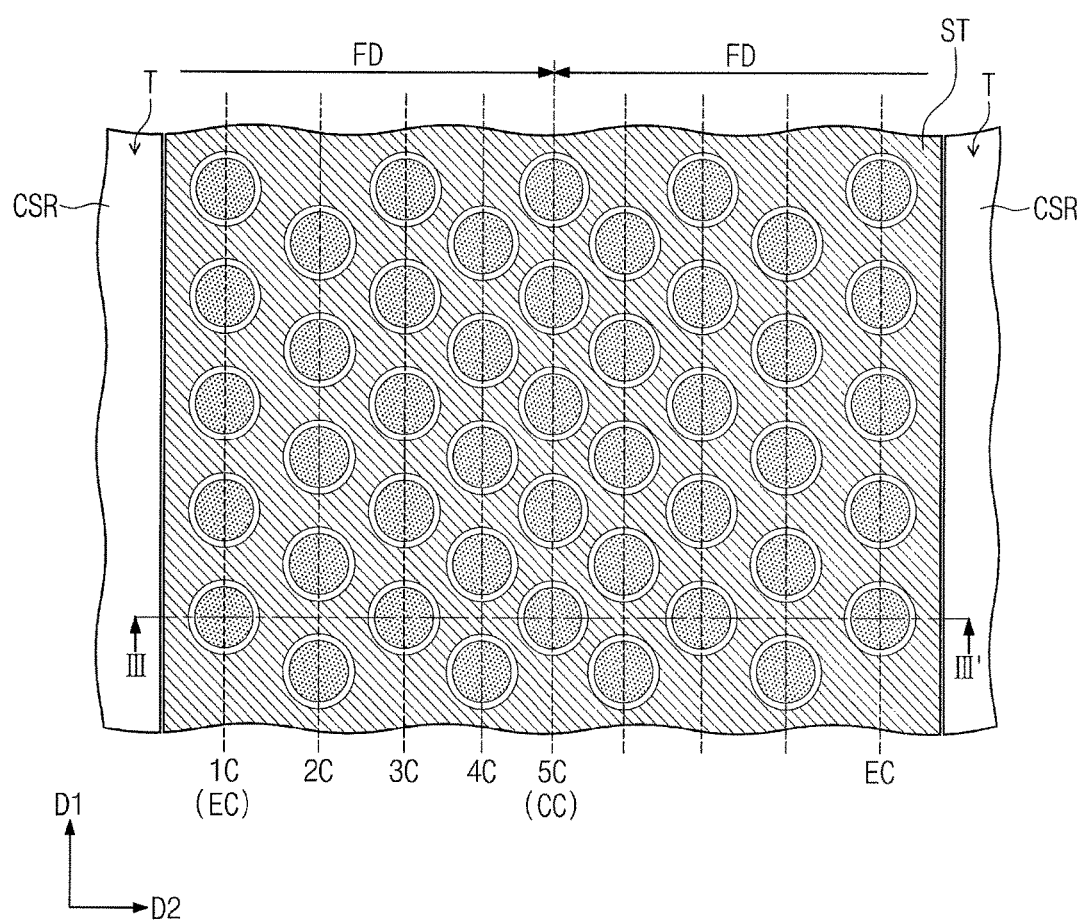
Figure 11B:
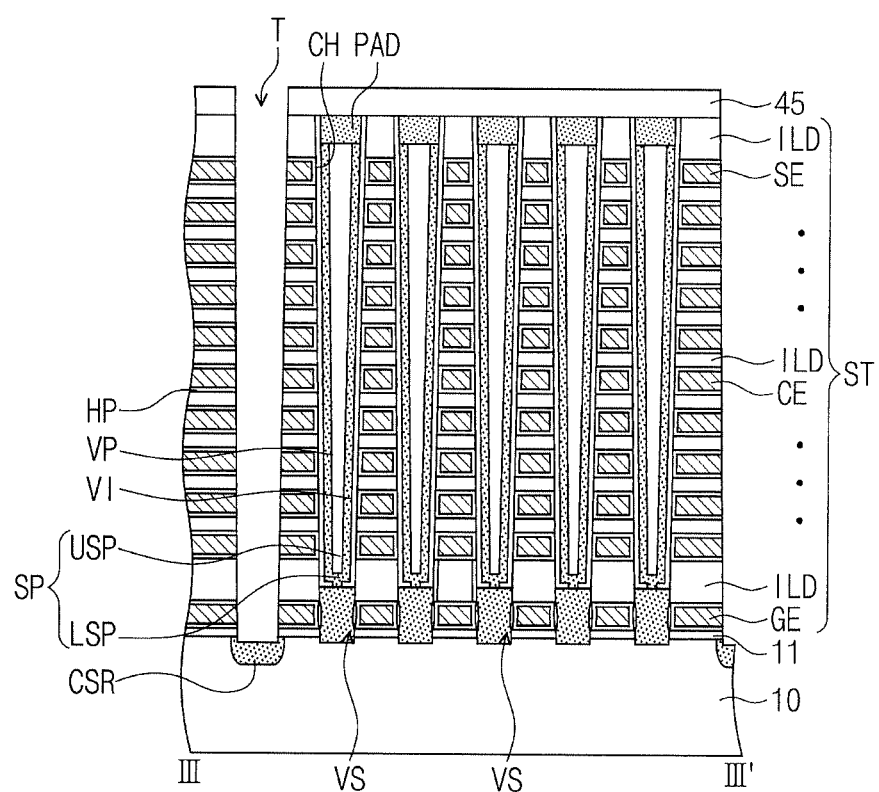

Referring to FIGS. 11A and 11B, horizontal insulating pattern HP and electrodes GE, CE, and SE may be formed in the gate regions GR. As a result, the electrode structure ST may be formed.

The formation of the horizontal insulating pattern HP and the electrodes GE, CE, and SE may include forming a horizontal insulating layer to conformally cover the gate regions GR, forming a gate conductive layer to fill the gate regions GR covered with the horizontal insulating layer, and removing the gate conductive layer from the trenches T to form the electrodes GE, CE, and SE, which are vertically separated from each other. Before the formation of the horizontal insulating pattern HP, the thermal oxide layer (e.g., see 13 of FIG. 3A) may be formed on a side surface of the lower semiconductor pattern LSP exposed by the lowermost one of the gate regions. The horizontal insulating pattern HP may be used as a part of a data storing layer of the NAND FLASH memory transistor. Each of the electrodes GE, CE, and SE may include a barrier metal layer and a metal layer stacked sequentially. The barrier metal layer may be formed of or include at least one of metal nitrides (e.g., TiN, TaN, or WN). The metal layer may be formed of or include at least one of metallic materials (e.g., W, Al, Ti, Ta, Co, or Cu). The gate conductive layer may be formed by a chemical vapor deposition method or an atomic layer deposition method.

A process of forming the plurality of electrodes GE, CE, and SE may include filling an empty space between the vertical structures VS with a source gas, and in this case, a space between the vertical structures VS may affect size, frequency, and the probability of forming a void in the particular electrode, (i.e., an empty space in the electrodes GE, CE, and SE). An etchant material may remain in the void. For example, in the case where the electrodes are formed of or include a tungsten layer, tungsten hexafluoride ($WF_6$) and hydrogen ($H_2$) may be used as source gases for forming a tungsten layer. In this case, hydrofluoric acid (HF) gas, which is produced from the reaction between the source gases, may remain in the void. Such an etchant material may lead to an unintended etching of an outer side surface of the vertical structures VS (in particular, the vertical insulating pattern VP).

According to some embodiments of the inventive concept, the vertical structures VS may be configured to have an arrangement or shapes allowing the source gas to be more effectively supplied in a horizontal direction, and this may make it possible to suppress the formation of the void. The source gas may be supplied into the gate regions GR through the trenches T, as depicted by a source-gas supply direction FD of FIG. 11A. According to some embodiments of the inventive concept, the distance between the columns or between the vertical structures may decrease in a direction from the edge columns EC to the center column CC. The distance between the columns may be relatively large at a region close to the trenches T or near the entrance of the supply path of the source gas, and thus, the source gas may be more easily supplied into the space between the vertical structures VS. The distance between the columns may be relatively small at a region far apart from the trenches T, and thus, the space between the vertical structures VS may be more easily filled with the material used to form the electrodes, for example. Accordingly, it may be possible to improve process reliability of a three-dimensional semiconductor device.

After the formation of the electrode structures ST, common source regions CSR may be formed in the substrate 10 exposed by the trenches T. The common source regions CSR may extend parallel to each other and in the first direction D1 and may be spaced apart from each other in the second direction D2. The common source regions CSR may be formed by doping the substrate 10 with impurities that are of a different type from that of the substrate 10. The common source regions CSR may contain, for example, n-type impurities (e.g., arsenic (As) or phosphorus (P)).

Referring back to FIGS. 2, 3A to 3C, and 4, insulating spacers SS and common source plugs CSP may be formed in the trenches T. The formation of the insulating spacer SS may include depositing a spacer layer on the substrate 10 to conformally cover the electrode structures ST, and then, performing an etch-back process on the spacer layer to expose the common source region CSR. Here, the insulating spacer SS may have a decreasing thickness in an upward direction (i.e., from bottom to top). The formation of the common source plugs CSP may include depositing a conductive layer to fill the trenches T provided with the insulating spacer SS, and then, performing a planarization process on the conductive layer to expose a top surface of the capping insulating pattern 45.

A dummy insulating separation layer DV may be formed to horizontally divide the upper selection electrode SE to provide a first upper selection electrode SE1 and a second upper selection electrode SE2 separated from each other by the dummy insulating separation layer DV. A bottom surface of the dummy insulating separation layer DV may be positioned above a top surface of the uppermost one of the cell electrodes CE. The formation of the dummy insulating separation layer DV may include forming a trench-shaped region to penetrate the capping insulating pattern 45, the uppermost one of the insulating layers ILD, and the upper selection electrode SE and to extend in the first direction D1, and then, filling the trench-shaped region with an insulating material (e.g., silicon oxide). The trench-shaped region may be formed to partially expose side surfaces of the vertical structures VS constituting the center column CC. Thereafter, a first interlayered insulating layer 51 may be formed to cover a top surface of the dummy insulating separation layer DV.

First, second, third, and fourth subsidiary lines SBL1, SBL2, SBL3, and SBL4 may be formed on the first interlayered insulating layer 51. The first to fourth subsidiary lines SBL1-SBL4 may be formed to have a longitudinal axis parallel to the second direction D2 and may be connected to two adjacent ones of the vertical structures VS through lower contacts LCP. First bit lines BL1 and second bit lines BL2 may be alternately formed on a second interlayered insulating layer 53 to extend in the second direction D2. The first bit lines BL1 may be connected to the first or second subsidiary lines SBL1 or SBL2 through an upper contact UCP, and the second bit lines BL2 may be connected to the third or fourth subsidiary lines SBL3 or SBL4 through the upper contact UCP.

According to some embodiments of the inventive concept, a distance between columns of vertical structures may be relatively large near entrance of a supply path of a source gas compared to the distance between the columns of the vertical structures that are relatively remote from the entrance of a supply path, and this may make it possible to more easily supply a source gas between the columns. The distance between columns of vertical structures may be small at a region far apart from the entrance of the supply path of the source gas, and this may make it possible to more easily form the electrodes between the vertical structures. Accordingly, it may be possible to improve process reliability of a three-dimensional semiconductor device.

While example embodiments of the inventive concepts have been particularly shown and described, it will be understood by one of ordinary skill in the art that variations in form and detail may be made therein without departing from the spirit and scope of the attached claims.

What is claimed:

1. A three-dimensional semiconductor device, comprising:
    an electrode structure including a plurality of electrodes stacked on a substrate and extending in a first direction; and
    vertical structures penetrating the electrode structure to provide a plurality of columns spaced apart from each other in a second direction crossing the first direction,
    wherein each of the plurality of columns includes the vertical structures arranged in the first direction,
    the plurality of columns include first and second edge columns located adjacent to respective opposite edges of the electrode structure, and the plurality of columns including a center column located between the first and second edge columns, and
    distances between adjacent ones of the plurality of columns decrease in a direction from the first edge column toward the center column.

2. The device of claim 1, wherein the adjacent ones of the plurality of columns are shifted in the first direction relative to one another.

3. The device of claim 1, wherein, at least one of the plurality of columns, the vertical structures arranged in the first direction are spaced apart from each other by substantially equal distances.

4. The device of claim 3, wherein, in each of the plurality of columns, the vertical structures in the first direction are spaced apart from each other by substantially equal distances.

5. The device of claim 1, wherein the electrode structure comprises an upper selection electrode and a plurality of cell electrodes located below the upper selection electrode, wherein the device further comprises:
    a dummy insulating separation layer penetrating the upper selection electrode; and
    wherein the vertical structures included in the center column penetrate the dummy insulating separation layer.

6. The device of claim 5, wherein the vertical structures are arranged to have mirror symmetry with respect to the dummy insulating separation layer.

7. The device of claim 1, wherein the electrode structure is provided between adjacent common source regions extending in the first direction, and
    the respective opposite edges of the electrode structure face the adjacent common source regions, when viewed in a plan view.

8. The device of claim 1, wherein shortest distances between the vertical structures, which are respectively selected from the plurality of columns and are closest to each other, decrease in a direction from the first or second edge columns toward the center column.

* * * * *